(12) United States Patent
Hardwick et al.

(10) Patent No.: US 8,557,421 B2
(45) Date of Patent: Oct. 15, 2013

(54) REUSABLE ELECTROCHEMICAL CELL TEST FIXTURE

(75) Inventors: Bobby Hardwick, Mitchell, IN (US); Kyle Deckard, Bloomington, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 555 days.

(21) Appl. No.: 12/648,138

(22) Filed: Dec. 28, 2009

(65) Prior Publication Data

US 2011/0159327 A1    Jun. 30, 2011

(51) Int. Cl.
*H01M 10/48* (2006.01)
*H01M 6/42* (2006.01)
*H01M 2/34* (2006.01)
*G01N 27/416* (2006.01)

(52) U.S. Cl.
USPC ............... 429/93; 429/9; 429/95; 429/123; 429/156; 324/426

(58) Field of Classification Search
USPC ............ 429/90, 99, 100, 9, 93, 95, 123, 156; 324/426, 430, 436; 73/446, 49.2; 340/636.15
See application file for complete search history.

(56) References Cited

U.S. PATENT DOCUMENTS

| | | | | |
|---|---|---|---|---|
| 1,358,827 A | * | 11/1920 | Case | 73/446 |
| 1,397,247 A | * | 11/1921 | Fitzgerald | 324/437 |
| 1,612,093 A | * | 12/1926 | Bowerman | 73/446 |
| 3,818,325 A | | 6/1974 | Boshers | |
| 3,873,911 A | * | 3/1975 | Champlin | 324/430 |
| 3,912,541 A | | 10/1975 | Britz et al. | |
| 3,939,400 A | * | 2/1976 | Steele | 324/434 |
| 4,278,744 A | | 7/1981 | Athearn | |
| 5,558,956 A | * | 9/1996 | Gujer et al. | 429/99 |
| 5,744,962 A | * | 4/1998 | Alber et al. | 324/426 |
| 6,177,799 B1 | * | 1/2001 | Martineau et al. | 324/425 |
| 6,795,782 B2 | * | 9/2004 | Bertness et al. | 702/63 |
| 2006/0024575 A1 | | 2/2006 | Robinson et al. | |
| 2009/0075167 A1 | | 3/2009 | Traulsen et al. | |

* cited by examiner

*Primary Examiner* — Kenneth Douyette
(74) *Attorney, Agent, or Firm* — Christopher A. Monsey

(57) ABSTRACT

A container for testing an electrochemical cell having at least one anode and at least one cathode. The container includes a base and a lid movably coupled to the base between an open position and a closed position. The base and the lid cooperate to define an internal cavity that is sized to receive the electrochemical cell.

16 Claims, 10 Drawing Sheets

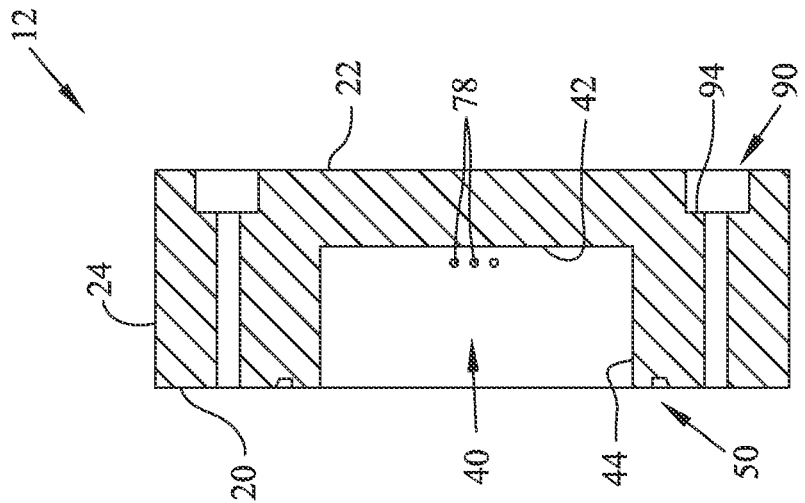
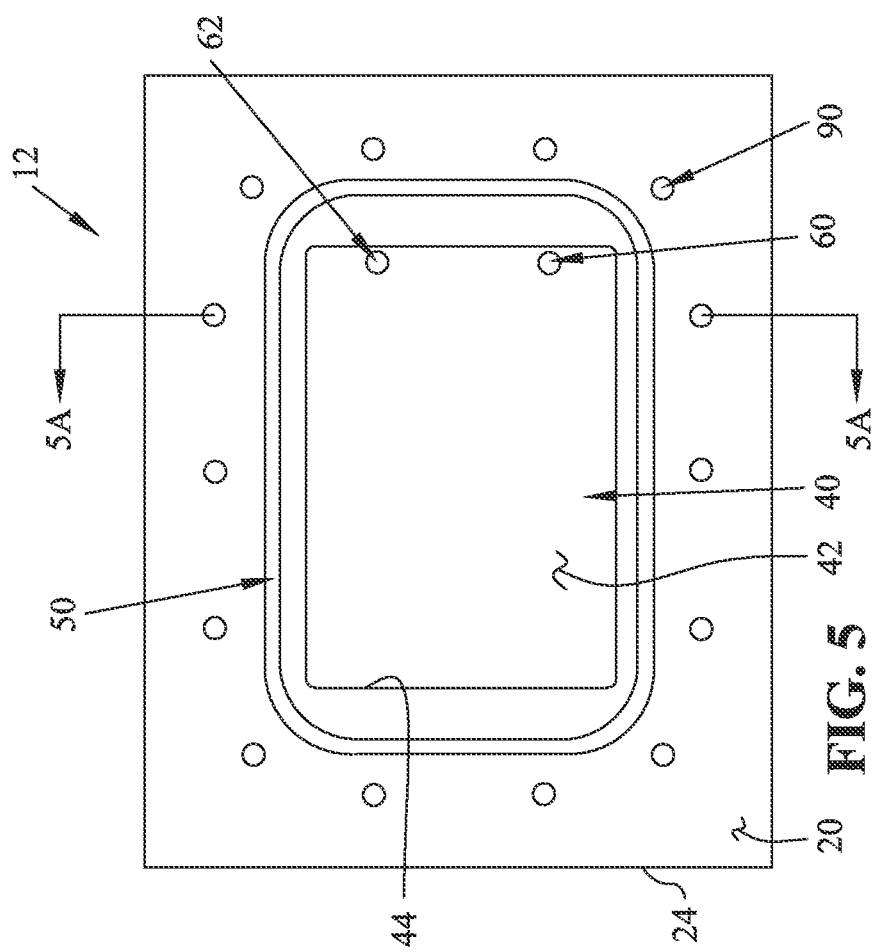

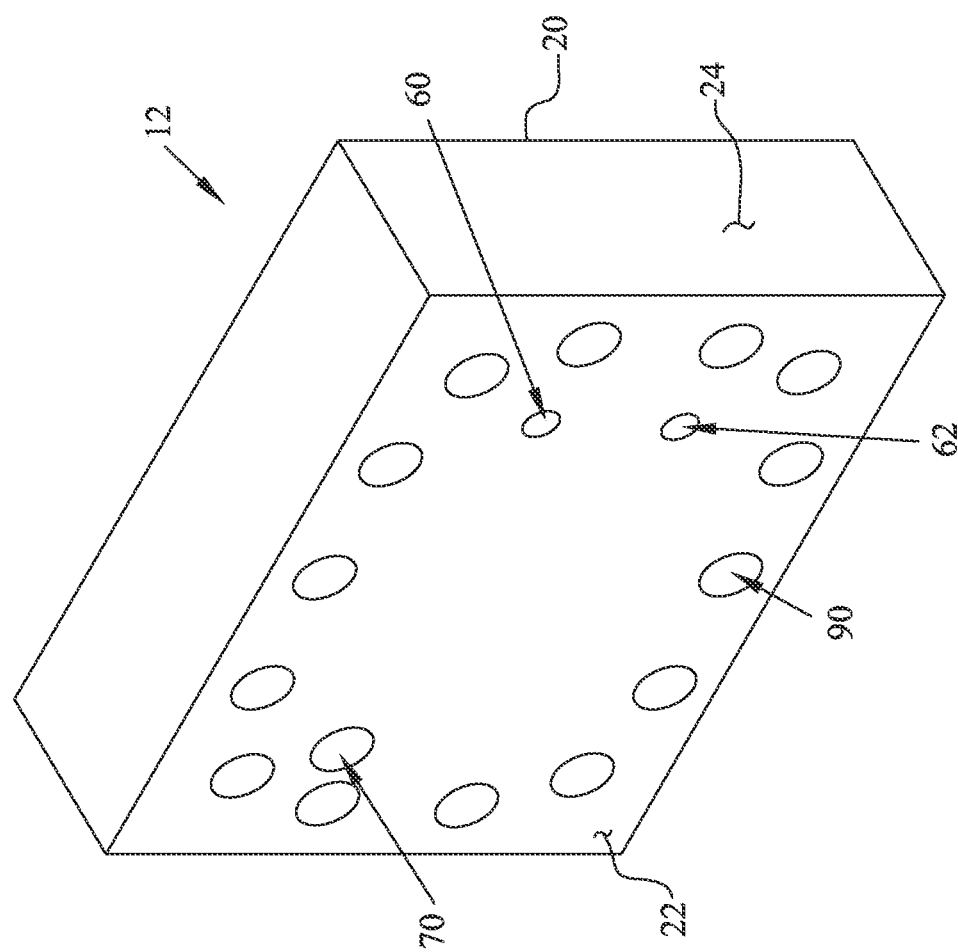

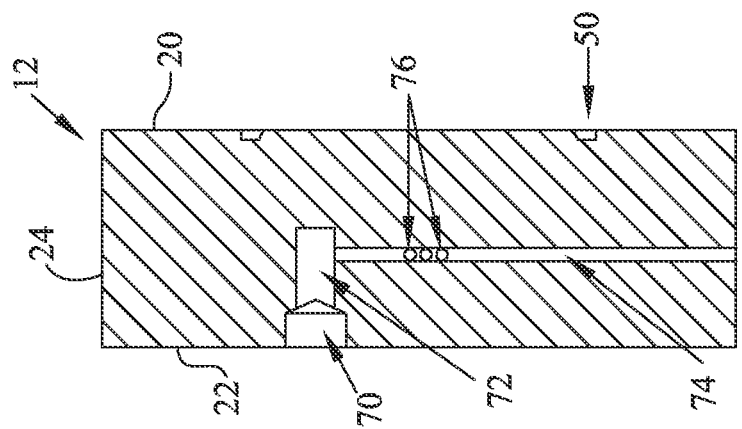
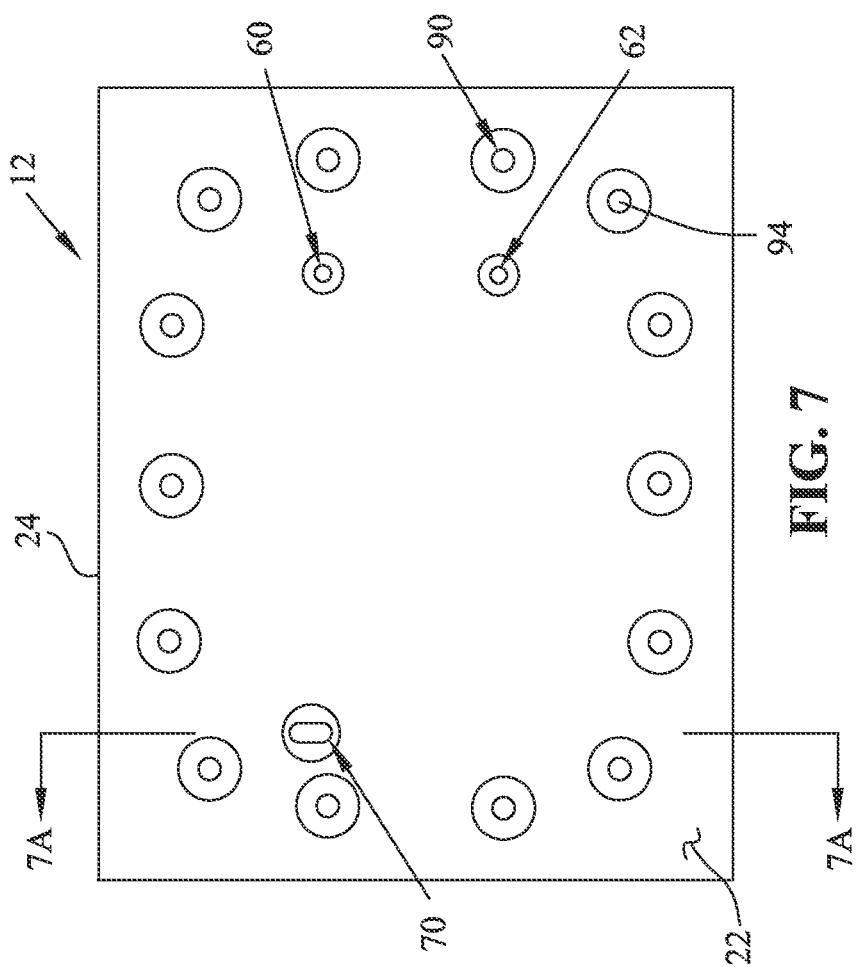

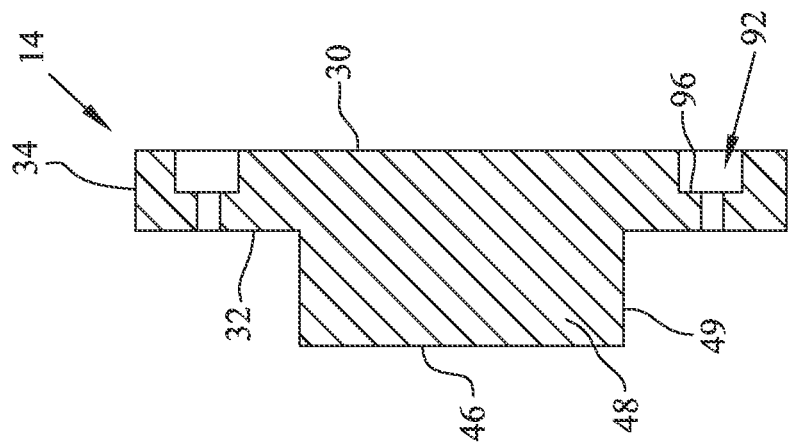
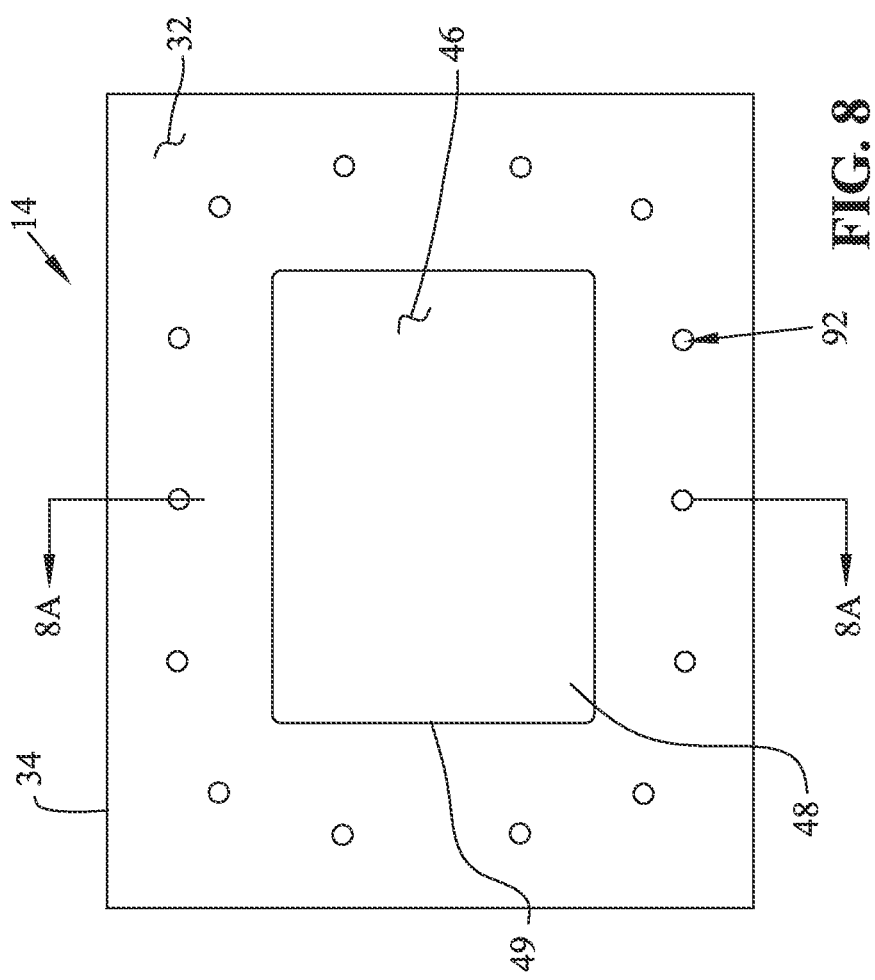

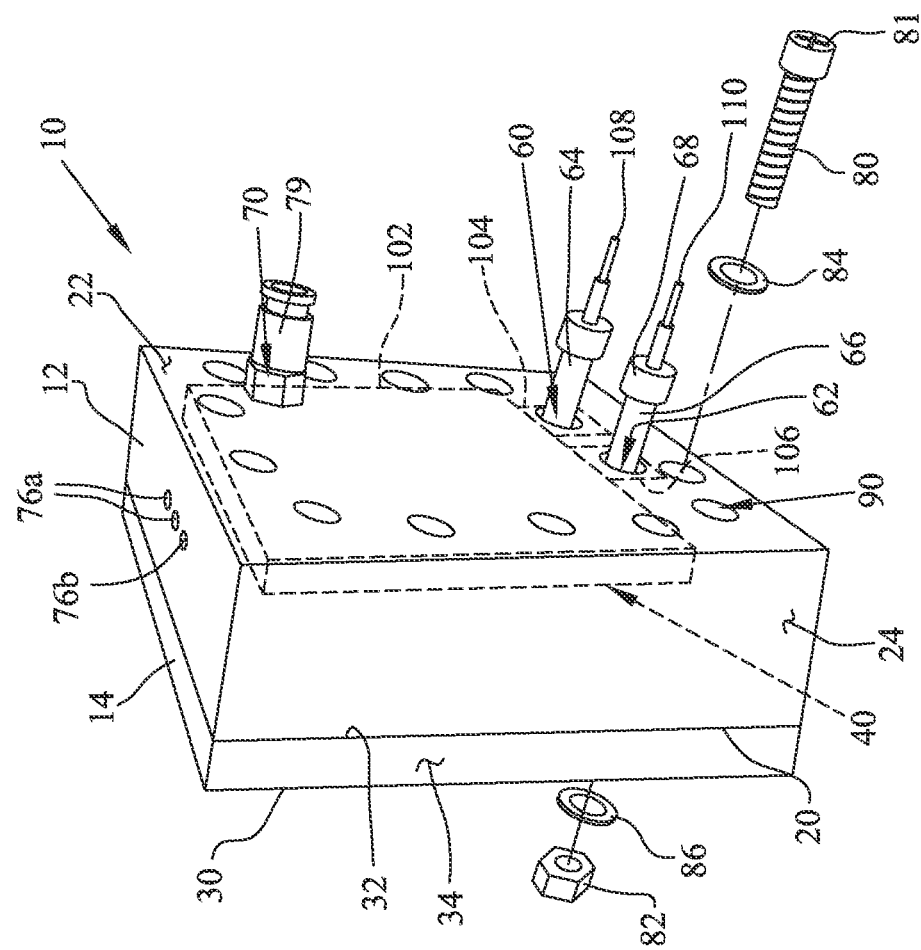

REUSABLE ELECTROCHEMICAL CELL TEST FIXTURE

STATEMENT REGARDING FEDERALLY SPONSORED RESEARCH OR DEVELOPMENT

The invention described herein was made in the performance of official duties by employees of the Department of the Navy and may be manufactured, used, licensed by or for the United States Government for any governmental purpose without payment of any royalties thereon.

BACKGROUND AND SUMMARY OF THE DISCLOSURE

The present disclosure relates to a test fixture. More particularly, the present disclosure relates to a test fixture for testing an electrochemical cell, and to a method for using the same.

Large-scale electrochemical batteries are often used in the military industry, such as to power missile systems and submarines, and in the aerospace industry, such as to power space shuttles and astronaut assistance equipment. Such large-scale batteries may contain numerous electrochemical cells and may be shielded by an outer case. For example, battery 100 shown in FIG. 1 contains over forty individual electrochemical cells 102 and is shielded by an outer aluminum case 101.

One cell 102 from battery 100 is shown in FIG. 2. Each individual cell 102 behaves like a distinct battery, having its own negative electrode (anode) 114 coupled to a negative terminal 104 and positive electrode (cathode) 116 coupled to a positive terminal 106. An exemplary cell may contain a plurality of negative plates as the anode 114 and a plurality of positive plates as the cathode 116.

The battery may be in the form of a silver-zinc battery, each individual cell having its own negative zinc electrode (anode) and positive silver oxide electrode (cathode). In use, the electrodes may be exposed to an electrolytic solution, such as sodium hydroxide (NaOH) or potassium hydroxide (KOH), so that the zinc at the anode is oxidized and the silver at the cathode is reduced.

Before a certain batch of batteries can be used in the field, an individual battery from the batch, such as battery 100 of FIG. 1, may be tested. Testing battery 100 may involve removing and testing individual cells of battery 100, such as cell 102 of FIG. 2. In the past, a tester would have to pot each cell in a liquid resin that, when hardened, formed a protective coating capable of containing the cell's corrosive, electrolytic solution. However, this potting process presented several disadvantages. First, the potting process was time consuming and expensive. In fact, two days were generally required to pot and test one individual cell. For a large, multi-cell battery, which may contain up to forty individual cells or more, the entire testing process could take up to six months. Also, the potting process could expose the tester to hazardous potting resins. Additionally, the potting resin released heat while curing, which artificially aged the cell being tested.

According to an illustrative embodiment of the present disclosure, a container is provided for testing an electrochemical cell having at least one anode and at least one cathode. The container includes a base and a lid movably coupled to the base between an open position and a closed position, the base and the lid cooperating to define an internal cavity that is sized to receive the electrochemical cell. With the lid in the closed position, the container includes a first opening into the internal cavity that is sized to receive a first wire in electrical communication with the at least one anode of the electrochemical cell, a second opening into the internal cavity that is sized to receive a second wire in electrical communication with the at least one cathode of the electrochemical cell, and a third opening into the internal cavity that is configured to direct an electrolytic solution into the internal cavity.

According to another illustrative embodiment of the present disclosure, the container is part of a system for testing a multi-cell battery having a first electrochemical cell and a second electrochemical cell. The internal cavity of the container is sized to interchangeably receive the first and second electrochemical cells.

According to yet another illustrative embodiment of the present disclosure, a method is provided for testing an electrochemical cell, the electrochemical cell having at least one anode and at least one cathode, the electrochemical cell including a first wire coupled to the at least one anode and a second wire coupled to the at least one cathode. The method includes the steps of: providing a container including a base and a lid, the base and the lid cooperating to define an internal cavity; placing the electrochemical cell within the internal cavity of the container with the first wire extending out of the container through a first opening in the container and the second wire extending out of the container through a second opening in the container; coupling the first and second wires to a test apparatus; closing the lid of the container; injecting an electrolytic solution into the internal cavity of the container through a third opening in the container; and using the test apparatus to test the electrochemical cell.

BRIEF DESCRIPTION OF THE DRAWINGS

The above-mentioned and other features and advantages of this invention, and the manner of attaining them, will become more apparent and the invention itself will be better understood by reference to the following description of embodiments of the invention taken in conjunction with the accompanying drawings, wherein:

FIG. 5 is a top plan view of the base of FIG. 3;

FIG. 5A is a cross-sectional view of the base of FIG. 5, taken along line 5A-5A of FIG. 5;

FIG. 6 is a bottom perspective view of the base of FIG. 3;

FIG. 7 is a bottom plan view of the base of FIG. 3;

FIG. 7A is a cross-sectional view of the base of FIG. 7, taken along line 7A-7A of FIG. 7;

FIG. 8 is a bottom plan view of the lid of FIG. 3;

FIG. 8A is a cross-sectional view of the lid of FIG. 8, taken along line 8A-8A of FIG. 8;

FIG. 9 is a perspective view of the container of FIG. 3 shown with the lid in a closed position;

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION OF THE DRAWINGS

Figure 2:
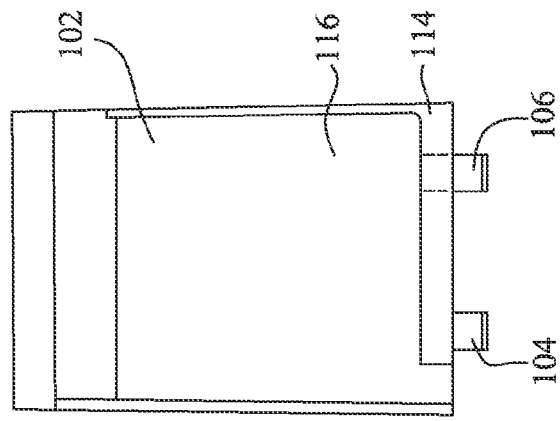
FIG. 2 is a plan view of an electrochemical cell from the battery of FIG. 1.
Figure 1:
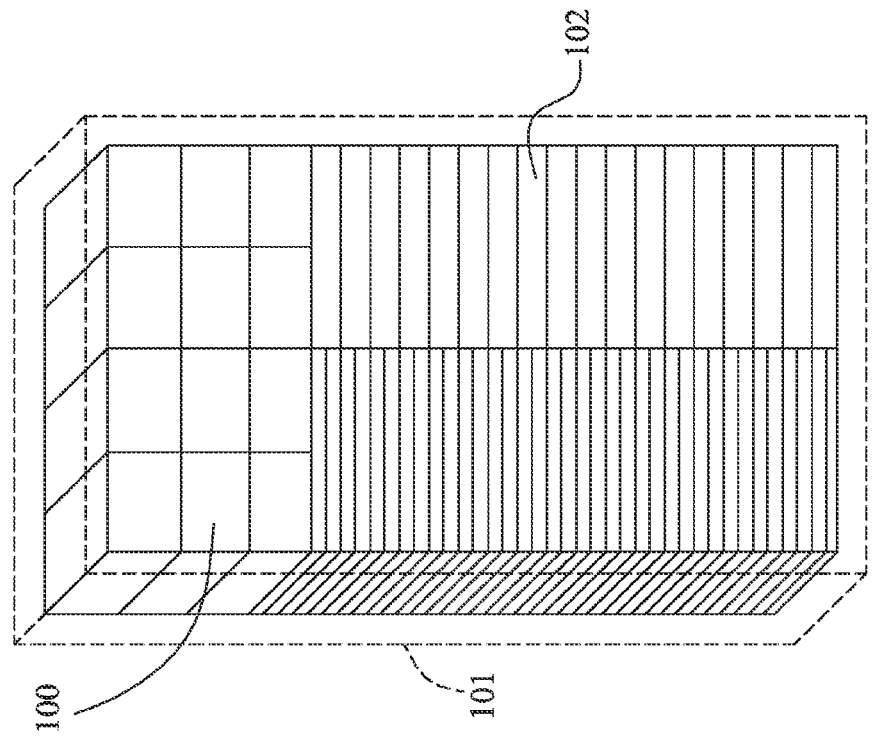
FIG. 1 is a perspective view of a multi-cell electrochemical battery.
Figure 3:
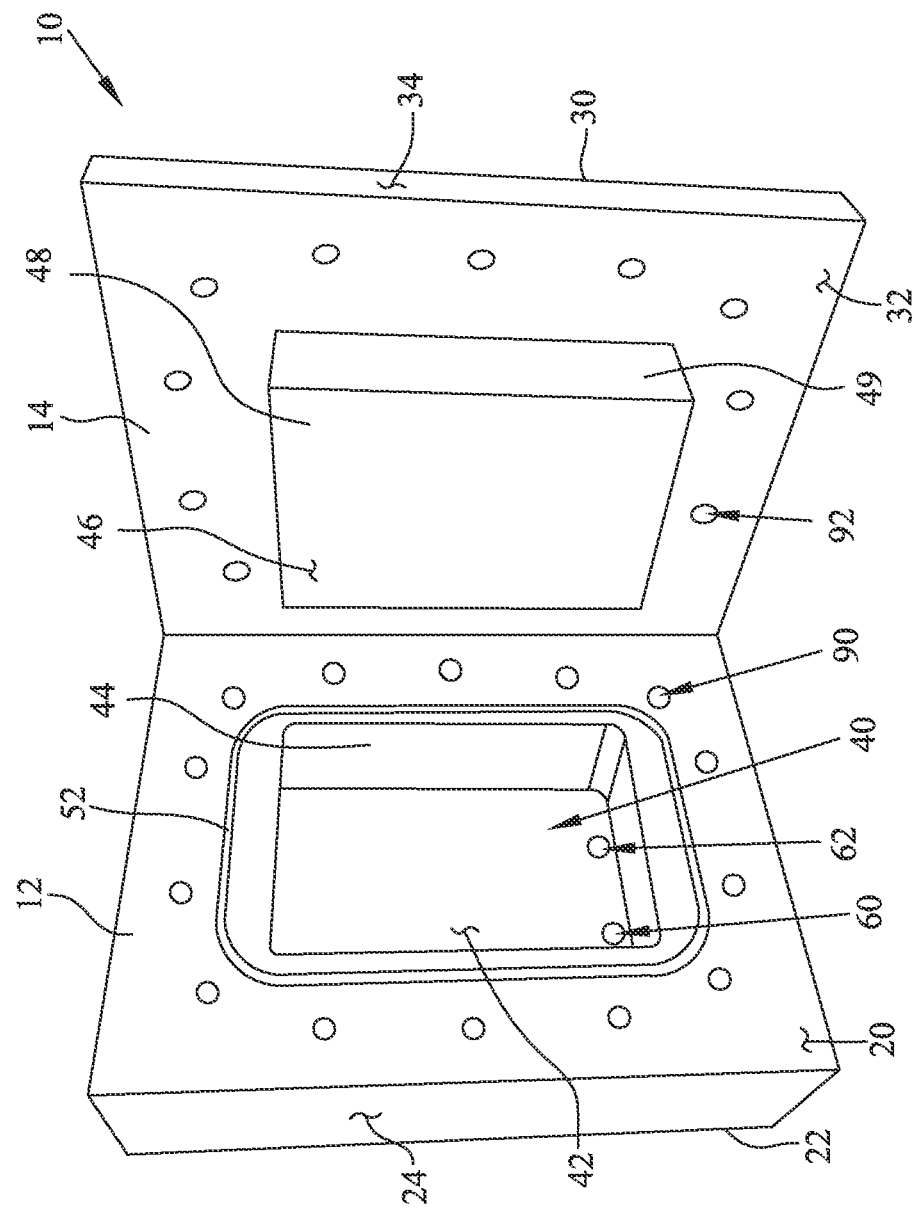
FIG. 3 is a perspective view of an illustrative embodiment container including a base and a lid, the container shown with the lid in an open position.

Referring to FIG. 3, an illustrative container 10 is provided for testing an individual electrochemical cell, such as electrochemical cell 102 of FIG. 2, or a group of individual electrochemical cells. As mentioned above, electrochemical cell 102 of FIG. 2 may contain a plurality of negative plates as the anode 114 and a plurality of positive plates as the cathode 116. The illustrative container 10 may be used to test the entire electrochemical cell 102 or a portion of that electrochemical cell 102, such as one positive plate from electrochemical cell 102 sandwiched between two negative plates from electrochemical cell 102. Thus, the illustrative container 10 may be used test an electrochemical cell having at least one anode and at least one cathode.

Container 10 is constructed of a material that is able to substantially withstand a corrosive, electrolytic solution, such as NaOH or KOH. For example, a suitable material may be capable of being immersed in the electrolytic solution for up to thirty days or more. According to an exemplary embodiment of the present disclosure, container 10 is constructed of a polycarbonate, such as Lexan™ brand polycarbonate resin thermoplastic. Lexan™ is a registered trademark of Sabic Innovative Plastics of the Netherlands. The material may also be transparent, such that a tester is able to see inside container 10.

Container 10 includes base 12 and lid 14 that is removably coupled to base 12. The illustrative base 12 of container 10 is shown in FIGS. 4-7. Base 12 includes top surface 20, bottom surface 22, and a substantially rectangular outer periphery 24. Base 12 may be approximately 8 inches, 10 inches, 12 inches, or more in length, and approximately 6 inches, 8 inches, 10 inches, or more in width. The thickness of base 12 from top surface 20 to bottom surface 22 may be approximately 2 inches, 2.25 inches, 2.5 inches, 2.75 inches, 3 inches, or more. The size of base 12 may vary depending on the size of electrochemical cell 102 being tested.

The illustrative lid 14 of container 10 is shown in FIG. 8. Lid 14 includes top surface 30, bottom surface 32, and a substantially rectangular outer periphery 34. Outer periphery 34 of lid 14 may be substantially the same shape and size as outer periphery 24 of base 12. The thickness of lid 14 from top surface 30 to bottom surface 32 may be approximately 0.5 inch, 0.75 inch, 1 inch, 1.25 inches, 1.5 inches, or more. Like base 12, the size of lid 14 may vary depending on the size of electrochemical cell 102 being tested.

As shown in FIG. 3, base 12 and lid 14 of container 10 cooperate to define internal cavity 40 that is sized to hold electrochemical cell 102 being tested and a requisite amount of electrolytic solution, as discussed further below. The illustrative base 12 defines bottom wall 42 and four side walls 44 of internal cavity 40. The illustrative lid 14 defines top wall 46 of internal cavity 40. More specifically, lid 14 includes protrusion 48 that projects from bottom surface 32 of lid 14 to define top wall 46 of internal cavity 40. Protrusion 48 may extend approximately 1 inch, 1.25 inches, 1.5 inches, 1.75 inches, 2 inches, or more beyond bottom surface 32 of lid 14. Thus, with bottom surface 32 of lid 14 resting against top surface 20 of base 12, protrusion 48 extends beyond top surface 20 of base 12 and along side walls 44 of internal cavity 40. In certain embodiments, side walls 49 of protrusion 48 may fit tightly against side walls 44 of internal cavity 40 to provide a seal around internal cavity 40. The depth of internal cavity 40, or the distance between bottom wall 42 and top wall 46 of internal cavity 40 when bottom surface 32 of lid 14 is resting against top surface 20 of base 12, may be approximately 0.2 inch, 0.4 inch, 0.6 inch, 1 inch, or more. The size of internal cavity 40 may vary depending on the size of electrochemical cell 102 being tested.

Internal cavity 40 of container 10 may be slightly larger in volume than electrochemical cell 102 being tested. For example, the depth of internal cavity 40 may exceed the thickness of electrochemical cell 102 being tested, the width of internal cavity 40 may exceed the width of the electrochemical cell 102 being tested, and/or the length of internal cavity 40 may exceed the length of the electrochemical cell 102 being tested. This excess space is illustratively minimized such that container 10 exerts some pressure on electrochemical cell 102 when lid 14 is closed, while providing enough space around electrochemical cell 102 to hold a requisite volume of electrolytic solution. For example, electrochemical cell 102 may fit snugly between bottom wall 42 and top wall 46 of internal cavity 40, with side walls 44 being spaced apart from electrochemical cell 102 to provide space for holding the requisite volume of electrolytic solution.

Figure 4:
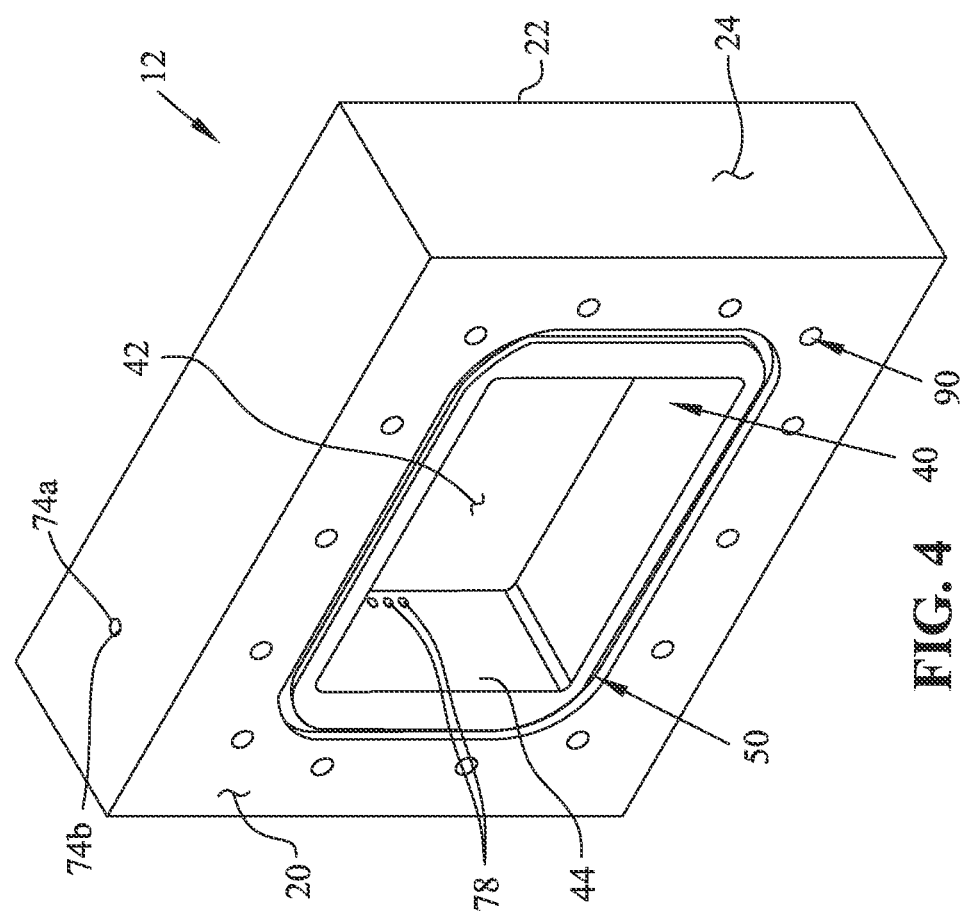
FIG. 4 is a top perspective view of the base of FIG. 3.

As shown in FIGS. 3-5, top surface 20 of base 12 defines groove 50 that surrounds internal cavity 40. Groove 50 is configured to receive seal 52. With bottom surface 32 of lid 14 resting against top surface 20 of base 12, seal 52 contacts both base 12 and lid 14 to seal internal cavity 40.

Referring to FIGS. 4-7, container 10, and more specifically base 12 of container 10, includes first aperture 60 and second aperture 62 that provide electrical access to internal cavity 40 of container 10. First and second apertures 60, 62, extend entirely through base 12 from bottom wall 42 of internal cavity 40, as shown in FIG. 5, to bottom surface 22 of base 12, as shown in FIG. 7.

As shown in FIG. 9, first and second apertures 60, 62, of container 10 are sized to receive first and second conductors or wires 108, 110, respectively. First and second wires 108, 110, may be 10-gauge solid copper wires, for example, and may be insulated. With electrochemical cell 102 positioned in internal cavity 40 of container 10, first wire 108 couples to negative terminal 104 of the tested electrochemical cell 102 and exits container 10 through first aperture 60, and second wire 110 couples to positive terminal 106 of the tested electrochemical cell 102 and exits container 10 through second aperture 62.

According to an exemplary embodiment of the present disclosure, container 10 includes first and second electrical feeds 64, 66, that communicate with first and second apertures 60, 62, respectively, to receive first and second wires 108, 110. First and second electrical feeds 64, 66, may be secured to base 12 of container 10 using a threaded connection or a suitable adhesive or epoxy, for example.

Exemplary first and second electrical feeds 64, 66, may be configured to grip onto wires 108, 110, to provide a watertight seal around wires 108, 110, thereby preventing an electrolytic solution from leaking out of internal cavity 40 of container 10 through first and second apertures 60, 62. For example, as shown in FIG. 9, each of the first and second electrical feeds 64, 66, includes nut 68 that may be adjusted to compress an internal washer (not shown), such as by forcing the washer into a narrowing channel, until the washer grips onto the corresponding wire 108, 110. Suitable electrical feeds 64, 66, may be generally available from Orgill, Inc. of Memphis, Tenn. and Simmons Manufacturing Company of McDonough, Ga., and may be sold as part of a 3-wire submersible splice kit.

Referring still to FIGS. 4-7, container 10, and more specifically base 12 of container 10, includes third aperture 70 that provides fluidic access to internal cavity 40 of container 10. As shown in FIG. 7A, third aperture 70 includes inlet channel 72, intermediate channel 74, and a plurality of outlet channels 76. Inlet channel 72 of third aperture 70 extends through bottom surface 22 of base 12 and about halfway into base 12. Intermediate channel 74 of third aperture 70 extends transversely from inlet channel 72 toward outer periphery 24 of base 12. Each outlet channel 76 of third aperture 70 extends from intermediate channel 74 through side wall 44 of internal cavity 40, such that side wall 44 of internal cavity 40 includes a plurality of openings 78 into internal cavity 40, as shown in FIGS. 4 and 5A.

Third aperture 70 may be formed by drilling into base 12 of container 10. For example, intermediate channel 74 of third aperture 70 may be formed by drilling into outer periphery 24 of base 12 at location 74a, as shown in FIG. 4. Also, outlet channels 76 of third aperture 70 may be formed by drilling into outer periphery 24 of base 12 at locations 76a, as shown in FIG. 9. After drilling, the open ends of third aperture 70 at locations 74a, 76a, may be sealed, such as with plugs 74b, 76b, respectively, to ensure that the electrolytic solution flows from inlet channel 72 to intermediate channel 74 to outlet channels 76 of third aperture 70 and into internal cavity 40 of base 12.

According to an exemplary embodiment of the present disclosure, and as shown in FIG. 9, container 10 includes fluid port 79 that communicates with third aperture 70. More specifically, fluid port 79 communicates with inlet channel 72 of third aperture 70. Fluid port 79 may be secured to base 12 of container 10 using a threaded connection or a suitable adhesive or epoxy, for example. In use, an auxiliary connector (not shown) may be coupled to fluid port 79 for evacuating internal cavity 40 of container 10 and for injecting an electrolytic solution into internal cavity 40 of container 10. An exemplary fluid port is a Swagelok™ Quick-Connect PTFE-Sealed QTM Series (SS-QTM4-S-400) fitting that has been adapted to be threaded into container 10. An exemplary and corresponding Swagelok™ Quick-Connect fitting may also be used as the auxiliary connector for supplying the electrolytic solution. These exemplary fluid ports and auxiliary connectors are available from Indiana Fluid System Technologies of Indianapolis, Ind. It is within the scope of the present disclosure that multiple fluid ports may be provided—one for evacuating internal cavity 40 of container 10 and another for injecting an electrolytic solution into internal cavity 40 of container 10.

Lid 14 may be secured onto base 12 of container 10 using suitable fasteners. According to an exemplary embodiment of the present disclosure, and as shown in FIG. 9, lid 14 is secured onto base 12 of container 10 using a plurality of bolts 80, nuts 82, and optional washers 84, 86. As shown in FIG. 3, base 12 of container 10 includes a plurality of bores 90 that are spaced around internal cavity 40, and lid 14 of container 10 includes a plurality of corresponding bores 92. As shown in FIG. 5A, each bore 90 of base 12 extends from top surface 20 to bottom surface 22 of base 12, with bore 90 narrowing toward bottom surface 22 of base 12 to define shoulder 94. Similarly, as shown in FIG. 8A, each bore 92 of lid 14 extends from bottom surface 32 to top surface 30 of lid 14, with bore 92 narrowing toward top surface 30 of lid 14 to define shoulder 96. In use, bolt 80 may be inserted into bore 90 of base 12 and through the corresponding bore 92 of lid 14, and nut 82 may be inserted into bore 92 of lid 14 and tightened onto bolt 80. With head 81 of bolt 80 resting against shoulder 94 of base 12 (FIG. 5A) and nut 82 resting against shoulder 96 of lid 14 (FIG. 8A), lid 14 may be tightened against base 12.

Figure 10:
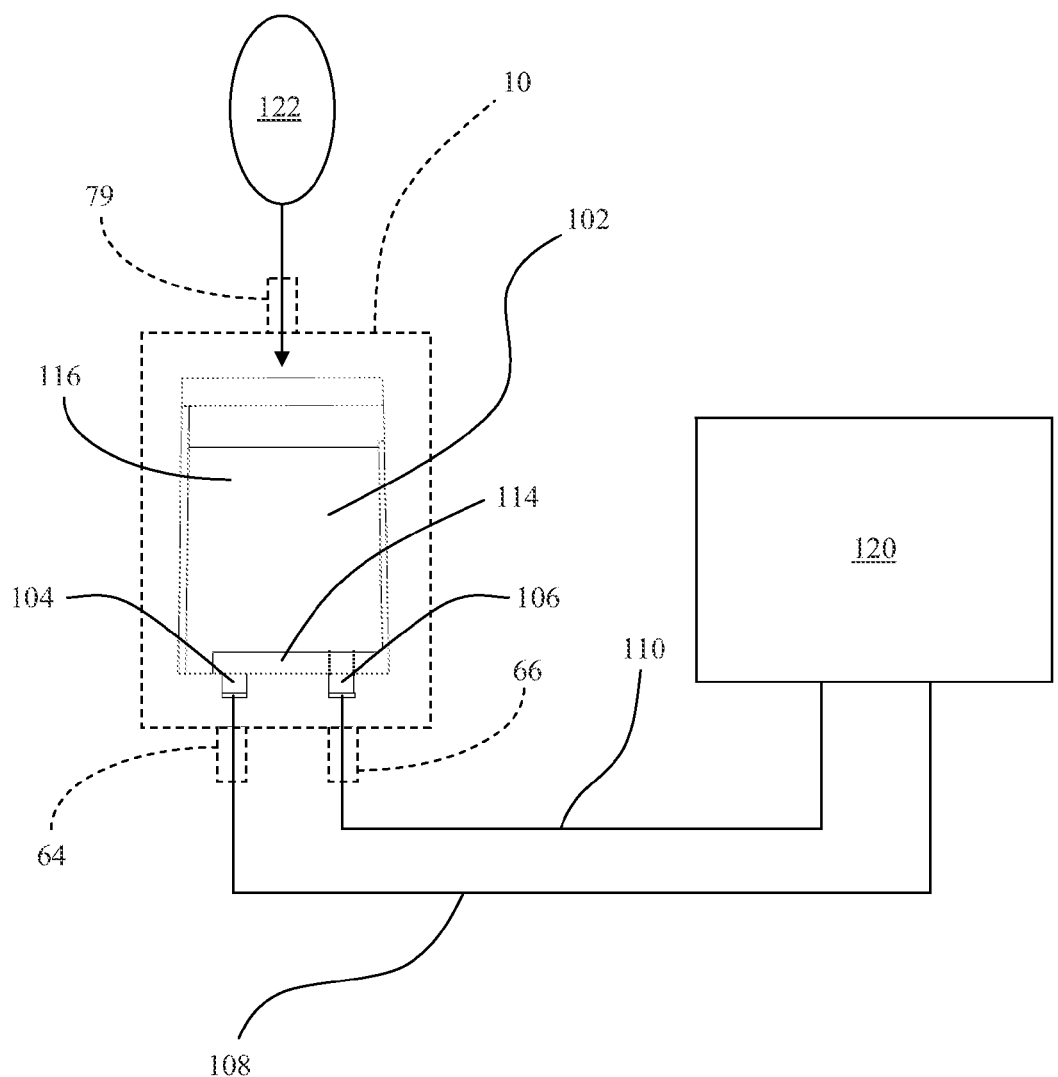
FIG. 10 is a schematic illustration of the electrochemical cell of FIG. 2 coupled to a battery testing apparatus for testing.
Figure 11:
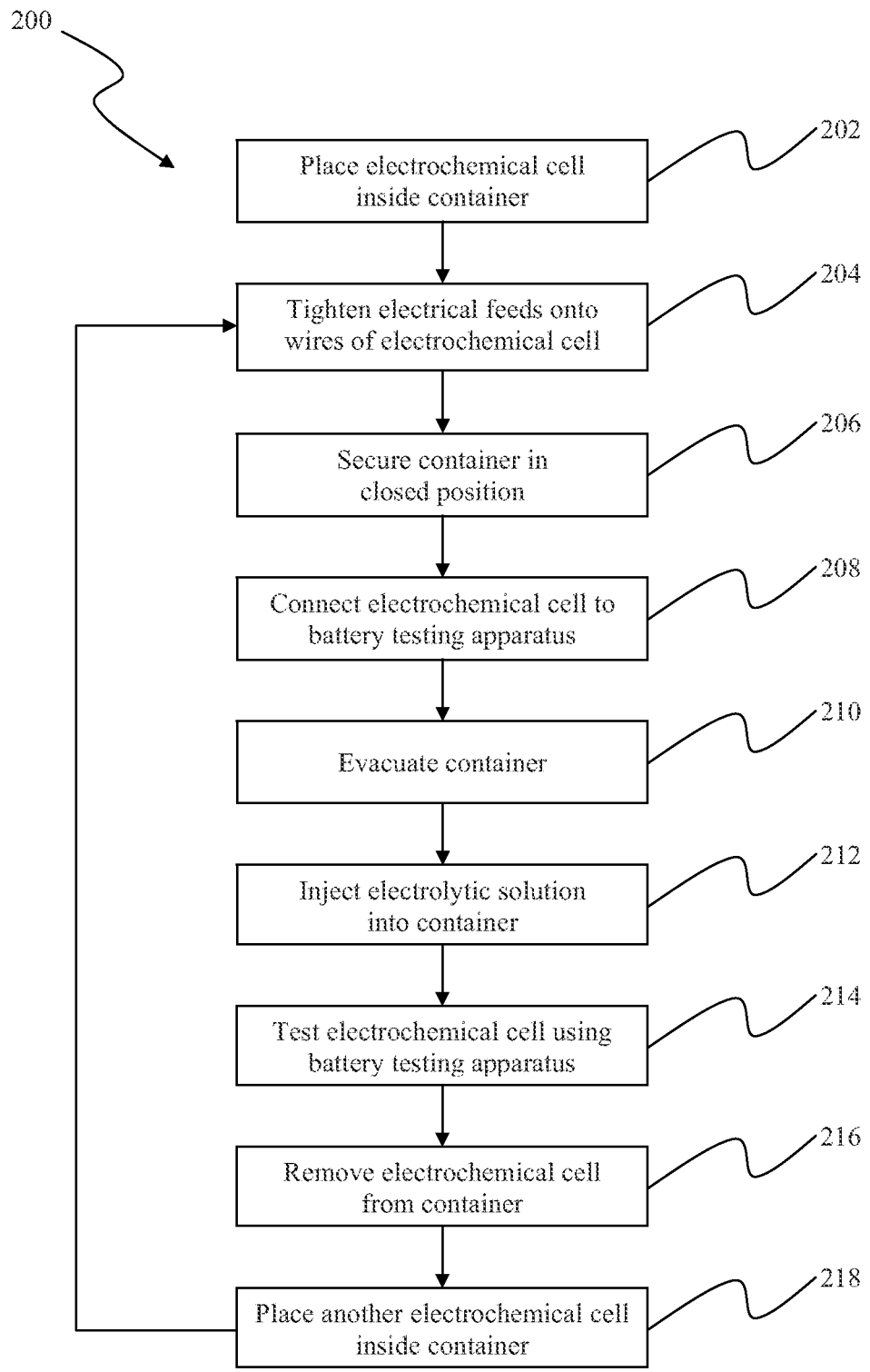
FIG. 11 is a flow diagram of an illustrative method.

An exemplary method 200 of using container 10 of the present disclosure is explained with reference to FIGS. 9-11. First, at step 202 of method 200, the tester places the electrochemical cell to be tested, such as electrochemical cell 102, inside internal cavity 40 of container 10 with first and second wires 108, 110, coupled to negative and positive terminals 104, 106, of electrochemical cell 102, respectively. As shown in FIG. 9, wires 108, 110, extend out of container 10 via first and second apertures 60, 62, and first and second electrical feeds 64, 66.

Optionally, at step 204 of method 200, the tester may tighten first and second electrical feeds 64, 66, onto wires 108, 110, as discussed above. Tightening first and second electrical feeds 64, 66, onto wires 108, 110, may provide a watertight seal around wires 108, 110.

Next, at step 206 of method 200, the tester closes container 10 and secures lid 14 onto base 12 in this closed position. For example, the tester may insert bolts 80 through base 12 and lid 14 of container 10 and tighten nuts 82 onto bolts 80.

Then, at step 208 of method 200, the tester connects first and second wires 108, 110, to a suitable battery testing apparatus 120. As shown in FIG. 10, first wire 108 is coupled to anode 114 of electrochemical cell 102 via negative terminal 104, and second wire 110 is coupled to cathode 116 of electrochemical cell 102 via positive terminal 106. Battery testing apparatus 120 may be configured to determine the remaining capacity of electrochemical cell 102, also known as the "state of charge," by providing a load on electrochemical cell 102 and monitoring the voltage and/or the discharge current from electrochemical cell 102, for example. An exemplary battery testing apparatus may include a first load component, such as an electronic load apparatus available from Transistor Devices, Inc., and a second monitoring component, such as an Odyssey™ test apparatus available from Nicolet Instrument Technologies, Inc. In operation, battery testing apparatus 120 may be controlled using a computing device having LabVIEW™ or Microsoft Basic software installed thereon.

At step 210 of method 200, and with lid 14 of container 10 securely closed, the tester may evacuate internal cavity 40. For example, the tester may evacuate container 10 by pulling a vacuum via fluid port 79.

Then, at step 212 of method 200, the tester may inject a requisite amount of the electrolytic solution under pressure into the evacuated internal cavity 40 via fluid port 79. According to an exemplary embodiment of the present disclosure, the tester may inject approximately 100 cubic centimeters of NaOH or KOH from fluid source 122 under a nitrogen back-pressure of approximately 80 psi through fluid port 79. If the back-pressure is not sufficient to prevent the electrolytic solution from leaking back out of fluid port 79, it is within the scope of the present disclosure that fluid port 79 may include a closeable valve.

The electrolytic solution travels through third aperture 70 of container 10 and enters internal cavity 40 of container 10 through openings 78 (FIG. 4), which may be located at an opposite end of container 10 from first and second apertures 60, 62, and first and second electrical feeds 64, 66. As the electrolytic solution flows around electrochemical cell 102, electrochemical cell 102 activates and testing may be initiated at step 214 of method 200 using battery testing apparatus 120. As discussed above, the tester may evaluate the remaining capacity of electrochemical cell 102 as a function of voltage and/or discharge current, for example.

After testing during step 214 of method 200, electrochemical cell 102 may be removed from container 10 during step 216 of method 200. For example, electrochemical cell 102 may be removed from container 10 by loosening bolts 80 and nuts 82 and opening container 10. Electrochemical cell 102 may be a primary cell that is discarded after testing.

Removing electrochemical cell 102 from container 10 does not require the destruction of an integral, potted coating. Rather, container 10 remains intact and may be used to test a second electrochemical cell. For example, at step 218 of method 200, the tester places the second electrochemical cell, which may be substantially similar to or identical to electrochemical cell 102, inside internal cavity 40 of container 10. Then, the tester repeats steps 204 thru 216 of method 200 to test the second electrochemical cell.

While this invention has been described as having preferred designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A system for testing a single cell removed from a multi-cell battery including:
    an electrochemical cell from the battery, the electrochemical cell including a negative terminal, a positive terminal, a first negative wire coupled to the negative terminal, and a positive wire coupled to the positive terminal;
    a container including a base and a lid movably coupled to the base between an open position and a closed position, the base and the lid cooperating to define an internal cavity that is sized to interchangeably receive the electrochemical cell, wherein said lid opens an entire side of said cavity and is adapted to permit insertion or removal of said electrochemical cell into said cavity;
    wherein, the container includes:
        a first opening into the internal cavity that is sized to interchangeably receive the negative wire of the first electrochemical cell;
        a second opening into the internal cavity that is sized to interchangeably receive the positive wire of the electrochemical cell;
        a plurality of third openings into the internal cavity that is configured to direct an electrolytic solution into the internal cavity, wherein the plurality of third openings communicates with an inlet channel formed through said base to a port section in an external surface of said base;
        an electrolytic port coupler connected to said port section adapted to couple a pressurized source for said electrolytic solution with a section of said inlet channel which defines an opening in said base; and
        a vacuum port coupler attached to either said port section or to said electrolytic port coupler which is in communication with said inlet channel and is adapted to facilitate evacuation of said cavity after said lid is in said closed position, said vacuum port coupler adapted to be coupled to a vacuum source;
    wherein the base of the container defines a bottom wall and a plurality of side walls of the internal cavity and the lid of the container defines a top wall of the internal cavity;
    wherein at least one of the bottom wall, the plurality of side walls, and the top wall exerts pressure on each of the first and second electrochemical cells when the lid is in the closed position;
    wherein said electrochemical cells comprise at least one positive or negative plate;
    wherein said container further comprises a first and second seal sections respectively disposed in a section of said first and second openings that form openings in an external surface of said base, said first seal section is formed to receive said negative wire, said second seal section is formed to receive said positive wire, wherein said first and second seal sections are further adapted to prevent said electrolytic solution from leaking out of said internal cavity of said container through first and second openings after said electrolytic solution is pressure injected into said container;
    wherein said container further includes a lid seal, wherein at least one of the base and the lid of the container defines a groove that surrounds the internal cavity for receiving the lid seal therein and is adapted to prevent electrolytic solution from leaking out of said internal cavity of said container between said lid and lid seal after said electrolytic solution is pressure injected into said cavity;
    wherein said container further comprises a plurality of removable fasteners disposed around said lid and through said base, said removable fasteners are adapted to secure said lid to said body such that said lid seal is compressed and adapted for said prevention of electrolytic solution from leaking out of said internal cavity up to a first pressure that is higher than an external pressure to said container after said container lid is in said closed position and said electrolytic solution is injected into said internal cavity.

2. The system of claim 1, wherein said first and second seal sections respectively comprise a first electrical feed coupled to the container in communication with the first opening and a second electrical feed coupled to the container in communication with the second opening, the first electrical feed being configured to interchangeably grip onto the negative wires and the second electrical feed being configured to interchangeably grip onto the positive wires.

3. The system of claim 1, wherein the first and second openings are located at an opposite end of the container from the third opening.

4. The system of claim 1, wherein said port couplers comprise a quick disconnect structure.

5. The system of claim 1, wherein said electrochemical cells are formed with a planar surface side and edges, wherein said lid is positioned on said base so that the lid is parallel with said planar surface side when said lid is in said closed position.

6. The system of claim 1, further comprising an electrochemical cell testing apparatus coupled to said wires and is adapted to determine the remaining capacity of electrochemical cell, including a state of charge, by providing a load on said electrochemical cell and monitoring a voltage and/or a discharge current from said electrochemical cell.

7. The system of claim 1, further comprising said vacuum source selectively coupled to said vacuum port coupler.

8. A system of claim 1, further comprising said electrolytic source selectively coupled to said electrolytic port coupler.

9. A system of claim 1, wherein said electrolytic coupler further comprises a closeable valve positioned in a path for communicating said electrolytic solution into said cavity which includes said electrolytic source, said electrolytic port coupler, said inlet channel, and said plurality of third openings.

10. A system of claim 2, wherein each of the first and second electrical feeds includes a nut that may be adjusted to compress an internal washer by forcing the washer into a narrowing channel within said electrical feeds, until the washer grips onto the corresponding wire and provides a seal to prevent said electrolytic solution from leaking past said washer when said electrolytic solution is under pressure.

11. The system of claim 1, wherein said port couplers each comprise a quick disconnect structure adapted to quickly disconnect said electrolytic source and said vacuum source.

12. The system of claim 1, said system further comprising:
an electrochemical cell testing apparatus coupled to said wires and is adapted to determine the remaining capacity of electrochemical cell, including a state of charge, by providing a load on said electrochemical cell and monitoring a voltage and/or a discharge current from said electrochemical cell;
said vacuum source selectively coupled to said vacuum port coupler;
said electrolytic source selectively coupled to said electrolytic port coupler; and
a closeable valve positioned in a path for communicating said electrolytic solution into said cavity which includes said electrolytic source, said electrolytic port coupler, said electrolytic inlet channel, and said plurality of third openings.

13. A system for testing a multi-cell battery including:
a first electrochemical cell from the battery, the first electrochemical cell including a first negative terminal, a first positive terminal, a first negative wire coupled to the first negative terminal, and a first positive wire coupled to the first positive terminal;
a second electrochemical cell from the battery, the second electrochemical cell including a second negative terminal, a second positive terminal, a second negative wire coupled to the second negative terminal, and a second positive wire coupled to the second positive terminal; and
a container including a base and a lid movably coupled to the base between an open position and a closed position, the base and the lid cooperating to define an internal cavity that is sized to interchangeably receive the first and second electrochemical cells;
wherein, with the lid in the closed position, the container includes:
a first opening into the internal cavity that is sized to interchangeably receive the first negative wire of the first electrochemical cell and the second negative wire of the second electrochemical cell;
a second opening into the internal cavity that is sized to interchangeably receive the first positive wire of the first electrochemical cell and the second positive wire of the second electrochemical cell;
a third opening into the internal cavity that is configured to direct an electrolytic solution into the internal cavity;
a port coupled to an external section of said base, said port is coupled to a section of said third opening, said port is configured to selectively couple with a vacuum source and facilitate evacuation of said cavity after said lid is in said closed position, said port is further configured to selectively couple to a pressurized electrolytic fluid source after said lid is in said closed position so as to convey pressurized electrolytic fluid into said interior cavity through said channel and said third opening;
wherein the base of the container defines a bottom wall and a plurality of side walls of the internal cavity and the lid of the container defines a top wall of the internal cavity;
wherein the lid of the container includes a protrusion that extends into the internal cavity when the lid is in the closed position;
wherein said container further comprises a first and second seal sections respectively disposed in a section of said first and second openings that form openings in an external surface of said base, said first seal section is formed to receive said first and second negative wires, said second seal section is formed to receive said first and second positive wires, wherein said first and second seal sections are further adapted to prevent said electrolytic solution from leaking out of said internal cavity of said container through first and second openings after said electrolytic solution is pressure injected into said container;
wherein said container further includes a lid seal, wherein at least one of the base and the lid of the container defines a groove that surrounds the internal cavity for receiving the lid seal therein and is further adapted to prevent electrolytic solution from leaking out of said internal cavity of said container between said lid and lid seal after said electrolytic solution is pressure injected into said cavity;
wherein said container further comprises a plurality of removable fasteners disposed around said lid and through said base, said removable fasteners are adapted to secure said lid to said body such that said lid seal is compressed to prevent electrolytic solution from leaking out of said internal cavity up to a first pressure that is higher than an external pressure to said container after said container lid is in said closed position and said electrolytic solution is injected into said internal cavity.

14. The system of claim 13, wherein said first and second seal sections respectively comprise a first electrical feed coupled to the container in communication with the first opening and a second electrical feed coupled to the container in communication with the second opening, the first electrical feed being configured to interchangeably grip onto the first and second negative wires and the second electrical feed being configured to interchangeably grip onto the first and second positive wires.

15. The system of claim 13, wherein the third opening of the container includes an inlet channel through said base that is configured to receive the electrolytic solution and a plurality of outlet channels in fluid communication with the inlet channel that are configured to deliver the electrolytic solution from the inlet channel into the internal cavity of the container.

16. The system of claim 13, wherein the first and second openings are located at an opposite end of the container from the third opening.

* * * * *